US008598663B2

United States Patent
Cheng et al.

(10) Patent No.: US 8,598,663 B2
(45) Date of Patent: Dec. 3, 2013

(54) SEMICONDUCTOR STRUCTURE HAVING NFET AND PFET FORMED IN SOI SUBSTRATE WITH UNDERLAPPED EXTENSIONS

(75) Inventors: Kangguo Cheng, Schenectady, NY (US); Bruce B. Doris, Brewster, NY (US); Balasubramanian S. Haran, Watervliet, NY (US); Ali Khakifirooz, Mountain View, CA (US); Pranita Kulkarni, Slingerlands, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 130 days.

(21) Appl. No.: 13/108,290

(22) Filed: May 16, 2011

(65) Prior Publication Data
US 2012/0292705 A1 Nov. 22, 2012

(51) Int. Cl.
*H01L 27/12* (2006.01)
*H01L 21/02* (2006.01)
*H01L 29/786* (2006.01)
*H01L 21/70* (2006.01)

(52) U.S. Cl.
USPC ........... 257/347; 257/344; 257/348; 257/349; 257/350; 257/351; 257/369; 257/E27.062

(58) Field of Classification Search
None
See application file for complete search history.

(56) References Cited

U.S. PATENT DOCUMENTS

| | | | |
|---|---|---|---|
| 4,577,391 A | 3/1986 | Hsia et al. | |
| 5,461,338 A | 10/1995 | Hirayama et al. | |
| 5,838,047 A | 11/1998 | Yamauchi et al. | |
| 6,198,134 B1 | 3/2001 | Inoue et al. | |
| 6,812,527 B2 | 11/2004 | Dennard et al. | |
| 7,259,428 B2 * | 8/2007 | Inaba | 257/347 |
| 7,342,266 B2 | 3/2008 | Belyansky et al. | |
| 7,479,418 B2 | 1/2009 | Cai et al. | |
| 7,638,376 B2 | 12/2009 | Wen et al. | |
| 8,119,473 B2 * | 2/2012 | Huang et al. | 438/199 |
| 2009/0065876 A1 * | 3/2009 | Chang et al. | 257/410 |
| 2010/0038686 A1 * | 2/2010 | Maitra et al. | 257/288 |
| 2010/0045364 A1 | 2/2010 | Law et al. | |

OTHER PUBLICATIONS

A. Bansal et al., "Optimal Dual-Vt design in Sub-100-nm PD/SOI and Double-Gate Technologies," IEEE Transactions on Electron Devices, vol. 55, No. 5, May 2008, pp. 1161-1169.

* cited by examiner

*Primary Examiner* — Michael Jung
(74) *Attorney, Agent, or Firm* — Law Offices of Ira D. Blecker, P.C.

(57) ABSTRACT

A semiconductor structure which includes a semiconductor on insulator (SOI) substrate. The SOI substrate includes a base semiconductor layer; a buried oxide (BOX) layer in contact with the base semiconductor layer; and an SOI layer in contact with the BOX layer. The semiconductor structure further includes a circuit formed with respect to the SOI layer, the circuit including an N type field effect transistor (NFET) having source and drain extensions in the SOI layer and a gate; and a P type field effect transistor (PFET) having source and drain extensions in the SOI layer and a gate. There may also be a well under each of the NFET and PFET. There is a nonzero electrical bias being applied to the SOI substrate. One of the NFET extensions and PFET extensions may be underlapped with respect to the NFET gate or PFET gate, respectively.

23 Claims, 5 Drawing Sheets

DEVICE CHARACTERISTICS

| CASE | BOX THICKNESS (nm) | SUBSTRATE BIAS (V) | FRONT CHANNEL $V_T$ | | DIBL (mV) | SUB-THRESHOLD SLOPE (mV/DECADE) |
|---|---|---|---|---|---|---|
| | | | $V_T$ (LINEAR) (V) | $V_T$ (SATURATION) (V) | | |
| CONVENTIONAL FET | 10 | 0 | 0.263 | 0.206 | 56.7 | 86.9 |
| SUBSTRATE BIAS TO CHANGE $V_T$ | 10 | -1 | 0.0842 | 0.0034 | 80.8 | 91.9 |
| SUBSTRATE BIAS WITH UNDERLAP JUNCTIONS | 10 | -1 | 0.099 | 0.0429 | 56.1 | 85.3 |

DEVICE GATE LENGTH = 25 nm        SOI THICKNESS = 6 nm

FIG. 5

SEMICONDUCTOR STRUCTURE HAVING NFET AND PFET FORMED IN SOI SUBSTRATE WITH UNDERLAPPED EXTENSIONS

BACKGROUND

The present invention relates to the fabrication of semiconductor devices on a semiconductor on insulator (SOI) substrate, and more particularly, to the fabrication of semiconductor devices having multiple threshold voltages ($V_T$) on an extremely thin SOI substrate.

Extremely thin SOI substrates (ETSOI), also known as fully depleted SOI (FDSOI), rely on an ultra-thin semiconductor (usually silicon) layer on a buried oxide layer. "Fully-depleted" means that the conducting channel of the transistor is depleted of charge by the time the transistor turns on which can only occur in SOI technologies because in bulk silicon there is an almost infinite source of charge available that cannot be depleted. The performance advantage of fully-depleted transistors comes from the fact that when there is no charge in the channel, the entire gate voltage is applied to create a conducting channel.

ETSOI is a viable device option for extending CMOS scaling. The device characteristics of ETSOI can be tuned by doping and/or applying back gate bias which enables device tuning and/or multiple threshold voltages ($V_T$).

BRIEF SUMMARY

The various advantages and purposes of the exemplary embodiments as described above and hereafter are achieved by providing, according to a first aspect of the exemplary embodiments, a semiconductor structure which includes a semiconductor on insulator (SOI) substrate. The SOI substrate includes a base semiconductor layer; a buried oxide (BOX) layer in contact with the base semiconductor layer; and an SOI layer in contact with the BOX layer. The semiconductor structure further includes a circuit formed with respect to the SOI layer. The circuit includes an N type field effect transistor (NFET) having source and drain extensions in the SOI layer and a gate; a P type field effect transistor (PFET) having source and drain extensions in the SOI layer and a gate; a first well in the base semiconductor layer under the NFET; and a second well in the base semiconductor layer under the PFET. There is a nonzero electrical bias being applied to the SOI substrate. One of the NFET extensions and PFET extensions are overlapped with respect to the NFET gate or PFET gate, respectively, and the other of the NFET extensions and PFET extensions are underlapped with respect to the NFET gate or PFET gate, respectively.

According to a second aspect of the exemplary embodiments, there is provided a semiconductor structure which includes a semiconductor on insulator (SOI) substrate. The SOI substrate includes a base semiconductor layer; a buried oxide (BOX) layer in contact with the base semiconductor layer; and an SOI layer in contact with the BOX layer. The semiconductor structure further includes a circuit formed with respect to the SOI layer. The circuit includes an N type field effect transistor (NFET) having source and drain extensions in the SOI layer and a gate; a P type field effect transistor (PFET) having source and drain extensions in the SOI layer and a gate. At least one of the NFET extensions and PFET extensions are underlapped with respect to the NFET gate or PFET gate, respectively.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIG. 5 is a chart of device characteristics comparing a conventional design, a design with a substrate bias and a design with a substrate bias and underlapped junction.

DETAILED DESCRIPTION

Figure 1:
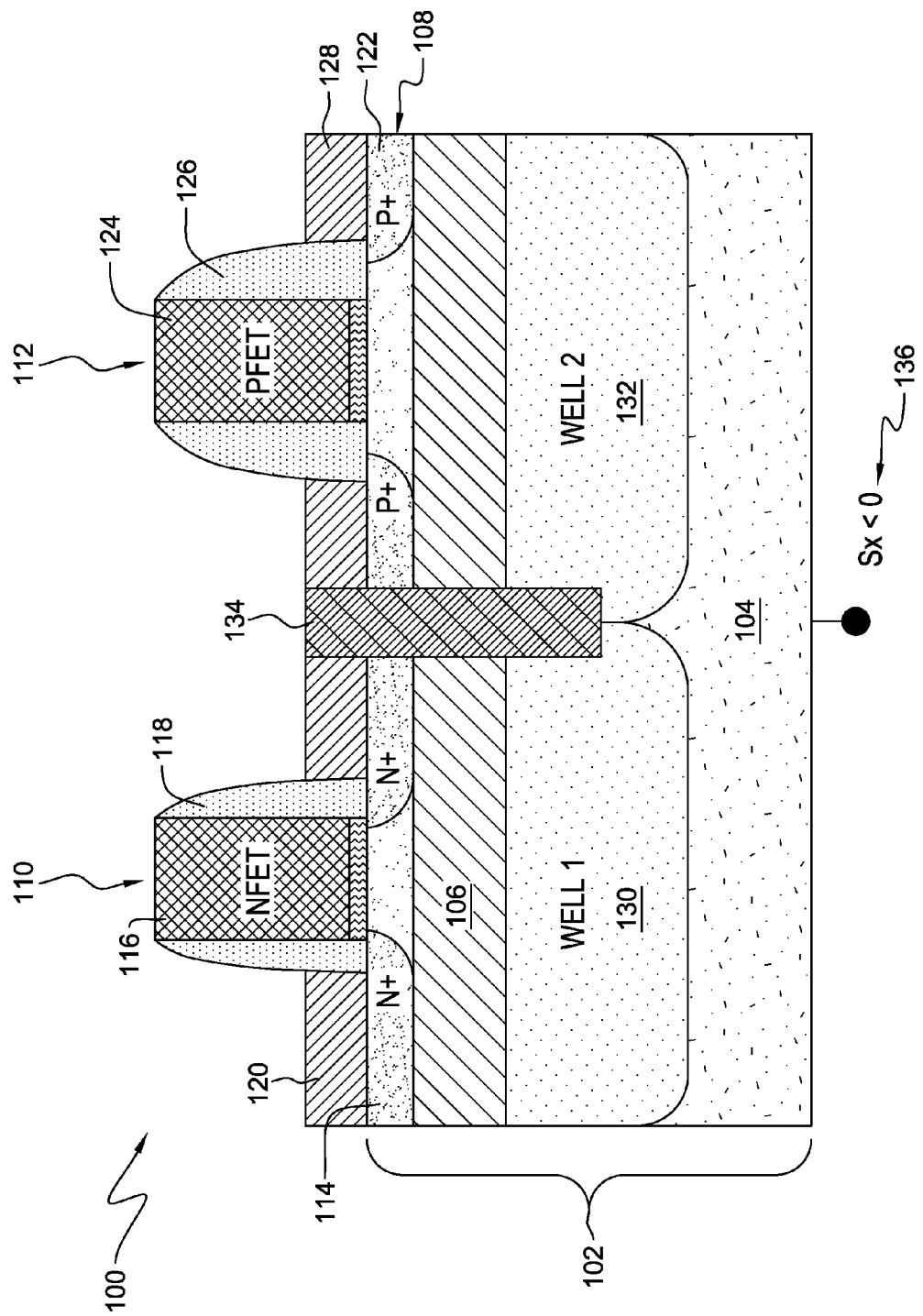
FIG. 1 is a cross sectional view of a first exemplary embodiment of a semiconductor structure wherein an NFET device is overlapped and a PFET device is underlapped.

Fully-depleted SOI devices such as extremely-thin (less than 15 nanometers) semiconductor-on-insulator (ETSOI) provide superior short-channel control over conventional bulk complementary metal oxide semiconductor (CMOS) devices and are considered promising candidates for scaling beyond the 22 nanometer node. However, fabricating different threshold voltage ($V_T$) devices on a single chip is not straightforward. In conventional bulk devices, different $V_T$ devices are manufactured by adjusting the channel doping by either halo or well implants. As the device length scales, the concentration of dopant atoms necessary to get a desired $V_T$ shift gets higher and exacerbates $V_T$ variability due to random dopant fluctuations. ETSOI devices by virtue of an undoped body offer immunity to random dopant fluctuations.

Fabricating ETSOI devices with different $V_T$s using a well/halo implant approach requires very high implant doses to achieve appreciable change in $V_T$ due to the extremely thin SOI layer. These implants lead to SOI amorphization and subsequent thermal processing may not anneal the defects from this SOI layer because of insufficient single-crystal seed layer. The presence of defects and impurities has been shown to degrade the carrier mobility in ETSOI devices. Moreover, the channel doping brings the random dopant fluctuation-related $V_T$ variability similar to the one seen in conventional bulk devices.

Another approach to achieve multiple $V_T$ flavors in ETSOI devices is by tuning the gate work function. Typically, in integrated CMOS circuits, three different $V_T$ devices are desired for each polarity. Even if the three different gate workfunctions for two polarities are available, their integration into the CMOS process flow is a formidable challenge.

Yet another approach to obtain multiple $V_T$ is by biasing the substrate. In the gate-first approach, NFET-band-edge and mid-gap gate workfunctions are attainable for the inversion thickness targets required for 22 nanometers and beyond. With these choices for gate workfunctions, negative substrate bias is required to get regular- and low-$V_T$ PFET devices. The negative substrate bias for regular and, low-Vt PFET comes with a short-channel control penalty. For gate lengths less than 25 nanometers, severe degradation in Drain Induced Barrier Lowering (DIBL) and sub-threshold slope (Sub-$V_T$ Id-Vgs slope) is observed for PFET devices.

DIBL may be defined as the threshold voltage variation between low and high drain voltages.

As the integration degree of semiconductor devices increases, channel lengths of the semiconductor devices have progressively decreased. When the channel lengths decrease, the DIBL effect may occur and thus the characteristics of the semiconductor devices may be degraded.

The DIBL effect changes a threshold voltage of a semiconductor device, causing degradation in the operation characteristics of the semiconductor device. The degradation in the operation characteristics of the semiconductor device caused by the DIBL effect becomes significant as the channel length of the semiconductor device becomes shorter.

For PFET devices with gate lengths less than 25 nanometers and mid-gap or a near-mid-gap gate workfunction, negative substrate bias required to achieve regular- and low-$V_T$ leads to 40-80 millivolts degradation in DIBL. The negative substrate bias in effect accumulates the extension junctions thereby increasing the DIBL.

The present invention relates to a semiconductor structure including a substrate-bias multi-$V_T$ Complementary Metal Oxide Semiconductor (CMOS) solution with simplified gate-stack that does not require body doping where the threshold voltage ($V_T$) can be changed without degrading the electrostatics (such as DIBL) of the semiconductor device.

In an exemplary embodiment, it is proposed to fabricate a severely underlapped regular and low-$V_T$ PFET ETSOI device design for logic applications. Such a device with appropriate substrate bias would exhibit regular/low $V_T$ characteristics along with minimal short-channel penalty.

According to the exemplary embodiments, the overlap, underlap and substrate bias may be varied which enables the varying of $V_T$. Overlap and underlap will be described in more detail hereafter.

It would be desirable to be able to vary $V_T$ between an N-type field effect, transistor (NFET) and a P-type field effect transistor (PFET) while minimizing the DIBL effect.

The present invention relates to the fabrication of a circuit on a semiconductor on insulator (SOI) substrate which includes an SOI layer, which may typically be silicon, a buried oxide (BOX) layer and a bottom layer, which may also be silicon. The BOX layer may be for example silicon oxide. In exemplary embodiments, the SOI substrate is an extremely thin SOI substrate wherein the SOI layer has a thickness of about 3 to 15 nanometers. This is compared to a typical SOI substrate having an SOI layer with a thickness of about 40 to 100 nanometers.

Referring to the Figures in more detail, and particularly referring to FIG. 1, there is illustrated a first exemplary embodiment. In FIG. 1, a semiconductor structure 100 including an SOI substrate 102 is illustrated. The SOI substrate 102 includes a bottom layer 104, a BOX layer 106 and an SOI layer 108. In a preferred exemplary embodiment, the SOI layer 108 is an extremely thin SOI layer.

The semiconductor structure 100 may include a circuit including an NFET device 110 and a PFET device 112. The NFET device 110 includes source/drain extensions 114 formed in the SOI layer 108. The NFET device 110 has a gate structure 116, spacers 118 and raised source/drain 120. Similarly, the PFET device 112 includes source/drain extensions 122 formed in the SOI layer 108, gate structure 124, spacers 126 and raised source/drain 128.

The bottom layer 104 may be implanted to form Well 1 130 and Well 2 132 which will form the back gate for NFET 110 and PFET 112, respectively. NFET 110 is formed so as to be located over Well 1 130 and PFET 112 is formed so as to be located over Well 2 132. It is preferred that Well 1 be a P-type well and Well 2 be an N-type well The implanted specie for the P well 130 may be, for example, boron or boron fluoride (BF2) while the specie for the N well 132 may be, for example, arsenic or phosphorus. It is within the scope of the present invention for Well 1 130 to be an N-type well and Well 2 132 to be a P-type well so long as Well 1 130 and Well 2 132 are of opposite polarity. Separating the FET devices 110, 112 is shallow trench isolation (STI) 134.

In this first exemplary embodiment, there is a negative substrate bias 136 ($S_x$<0) commensurate with the BOX layer thickness (enough to cause a change in the front-gate $V_T$) applied to the semiconductor structure 100. For purposes of illustration and not limitation, with a BOX layer thickness of about 10 nanometers and a substrate bias of −1V, there will be a change of approximately 180 mV in $V_T$.

In the exemplary embodiment of FIG. 1, the NFET source/drain extensions 114 are "overlapped" with respect to the NFET gate structure 116 while the PFET source/drain extensions 122 are "underlapped" with respect to the PFET gate structure 124.

Figure 2:
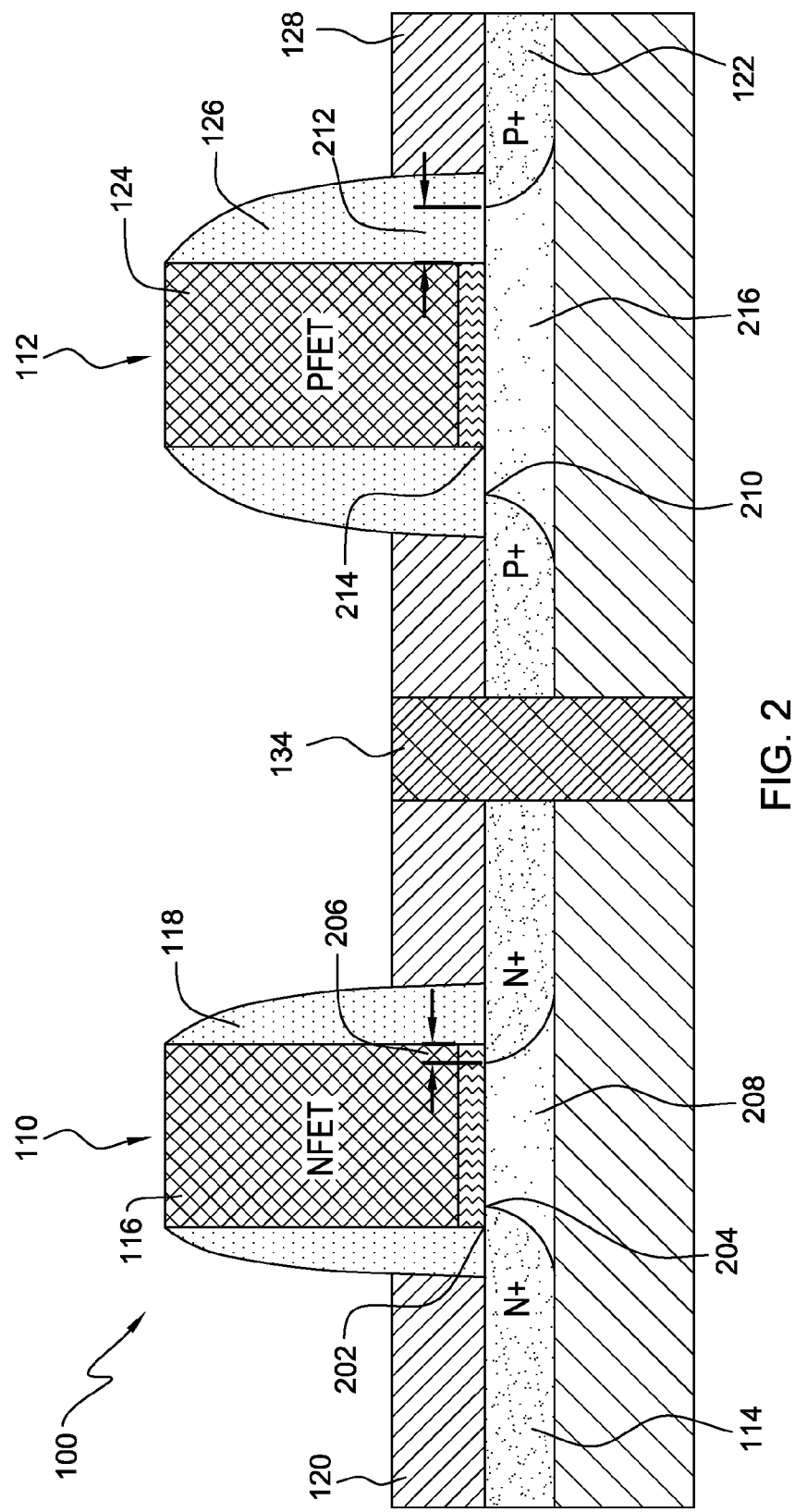
FIG. 2 is an enlarged cross sectional view of the first exemplary embodiment of FIG. 1.

Referring now to FIG. 2, there is illustrated an enlarged cross sectional view of the first exemplary embodiment of FIG. 1 which better shows the overlapped condition of the NFET device 110 and the underlapped condition of the PFET device 112. Considering first the NFET device 110, the gate structure 116 has a gate edge 202 while the source/drain extensions 114 create a metallurgical junction 204 with the gate channel 208. An overlapped condition may be defined as a structure where the metallurgical junction 204 extends into the gate channel 208. As shown in FIG. 2, the metallurgical junction 204 may extend into the gate channel 208 by a distance shown as 206, which for purposes of illustration and not limitation may be about 1 to 3 nanometers.

Considering now the PFET device 112 in FIG. 2, the gate structure 124 has a gate edge 214 while the source/drain extensions 122 create a metallurgical junction 210 with the gate channel 216. An underlapped condition may be defined as a structure where the metallurgical junction 210 is spaced away from the gate edge 214 and away from the gate channel 216. The metallurgical junction 210 is spaced from the gate edge 214 and the gate channel 216 by a distance indicated by 212. The distance 212 will vary depending on the gate length but for purposes of illustration and not limitation, the distance 212 should be about 2 to 6 nanometers for a gate length of 25 nanometers.

The NFET device 110 has spacers 118 and PFET device 112 has spacers 126. To accommodate the severely underlapped condition of the PFET device 112, the PFET spacers 126 may be enlarged to be bigger than the NFET spacers 118.

Figure 3:
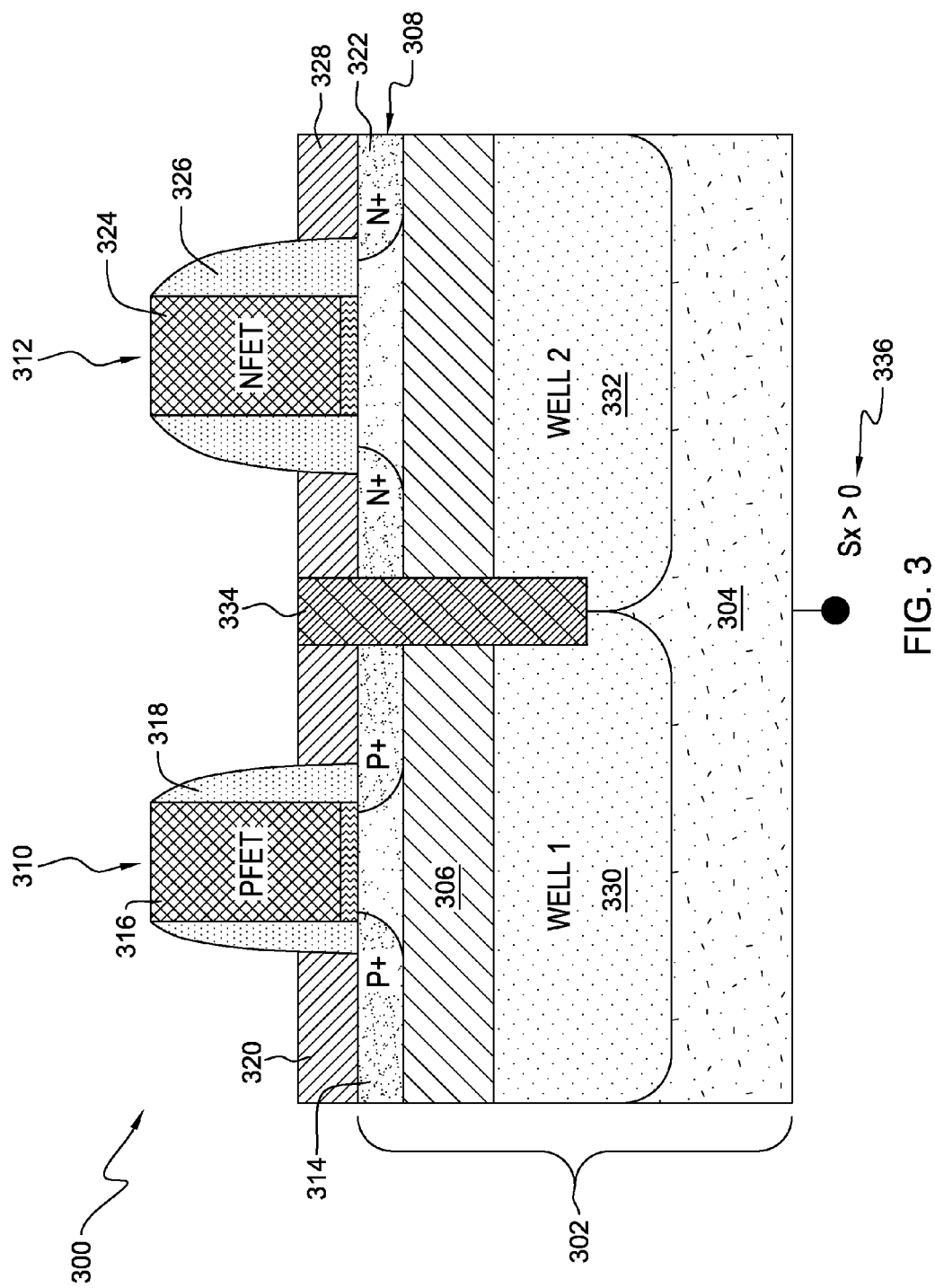
FIG. 3 is a cross sectional view of a second exemplary embodiment of a semiconductor structure wherein a PFET device is overlapped and an NFET device is underlapped.

Referring now to FIG. 3, there is shown a second exemplary embodiment of the invention. The second exemplary embodiment is similar to the first exemplary embodiment except that the PFET device is now overlapped, while the NFET device is underlapped and the substrate bias is positive ($S_x$>0).

In FIG. 3, a semiconductor structure 300 including an SOI substrate 302 is illustrated. The SOI substrate 302 includes a bottom layer 304, a BOX layer 306 and an SOI layer 308. In a preferred exemplary embodiment, the SOI layer 308 is an extremely thin SOI layer.

The semiconductor structure 300 may include a circuit including a PFET device 310 and an NFET device 312. The PFET device 310 includes source/drain extensions. 314 formed in the SOI layer 308. The PFET device 310 has a gate structure 316, spacers 318 and raised source/drain 320. Similarly, the NFET device 312 includes source/drain extensions 322 formed in the SOI layer 308, gate structure 324, spacers 326 and raised source/drain 328.

The bottom layer 304 may be implanted to form Well 1 330 and Well 2 332 which will form the back gate for PFET 310 and NFET 312, respectively. PFET 310 is formed so as to be located over Well 1 330 and NFET 312 is formed so as to be located over Well 2 332. It is preferred that Well 1 be an N-type well and Well 2 be a P-type well. The implanted specie for the N well 330 may be, for example, arsenic or phosphorus while the specie for the P well 332 may be, for example, boron or boron fluoride (BF2). It is within the scope of the present invention for Well 1 330 to be a P-type well and Well 2 132 to be an N-type well so long as Well 1 330 and Well 2 332 are of opposite polarity. Separating the FET devices 310, 312 is shallow trench isolation (STI) 334.

In this second exemplary embodiment, there is a positive substrate bias 336 commensurate with the BOX layer thickness (enough to cause a change in the front-gate $V_T$) applied to the semiconductor structure 300. For purposes of illustration and not limitation, with a BOX layer thickness of about 10 nanometers and a substrate bias of +1V, there will be a change of approximately 150 mV in $V_T$.

In the exemplary embodiment of FIG. 3, the PFET source/drain extensions 314 are "overlapped" with respect to the PFET gate structure 316 while the NFET source/drain extensions 322 are "underlapped" with respect to the NFET gate structure 324.

Overlapped and underlapped are as defined previously with respect to FIG. 2.

The semiconductor structure 100 in FIG. 1 depicts an underlapped PFET device and an overlapped NFET device while the semiconductor structure 300 in FIG. 3 depicts an underlapped NFET device and an overlapped PFET device. The advantages of the exemplary embodiments may be achieved if only the PFET device is underlapped in FIG. 1 while the NFET device is not overlapped or underlapped. The advantages of the exemplary embodiments also may be achieved if only the NFET device is underlapped in FIG. 3 while the PFET device is not overlapped or underlapped. Most preferably, a negative substrate bias should be applied when there is an underlapped PFET device as shown in FIG. 1 and a positive substrate bias should be applied when there is an underlapped NFET device as shown in FIG. 3.

The semiconductor structures 100, 300 may undergo additional conventional processing to form contacts and back end of the line wiring layers so as to form a semiconductor device such as a MOSFET. It is to be understood that the semiconductor structures shown in FIGS. 1 to 3 form only a part of a MOSFET and that there will be a plurality of such semiconductor structures in the finished MOSFET.

Figure 4:
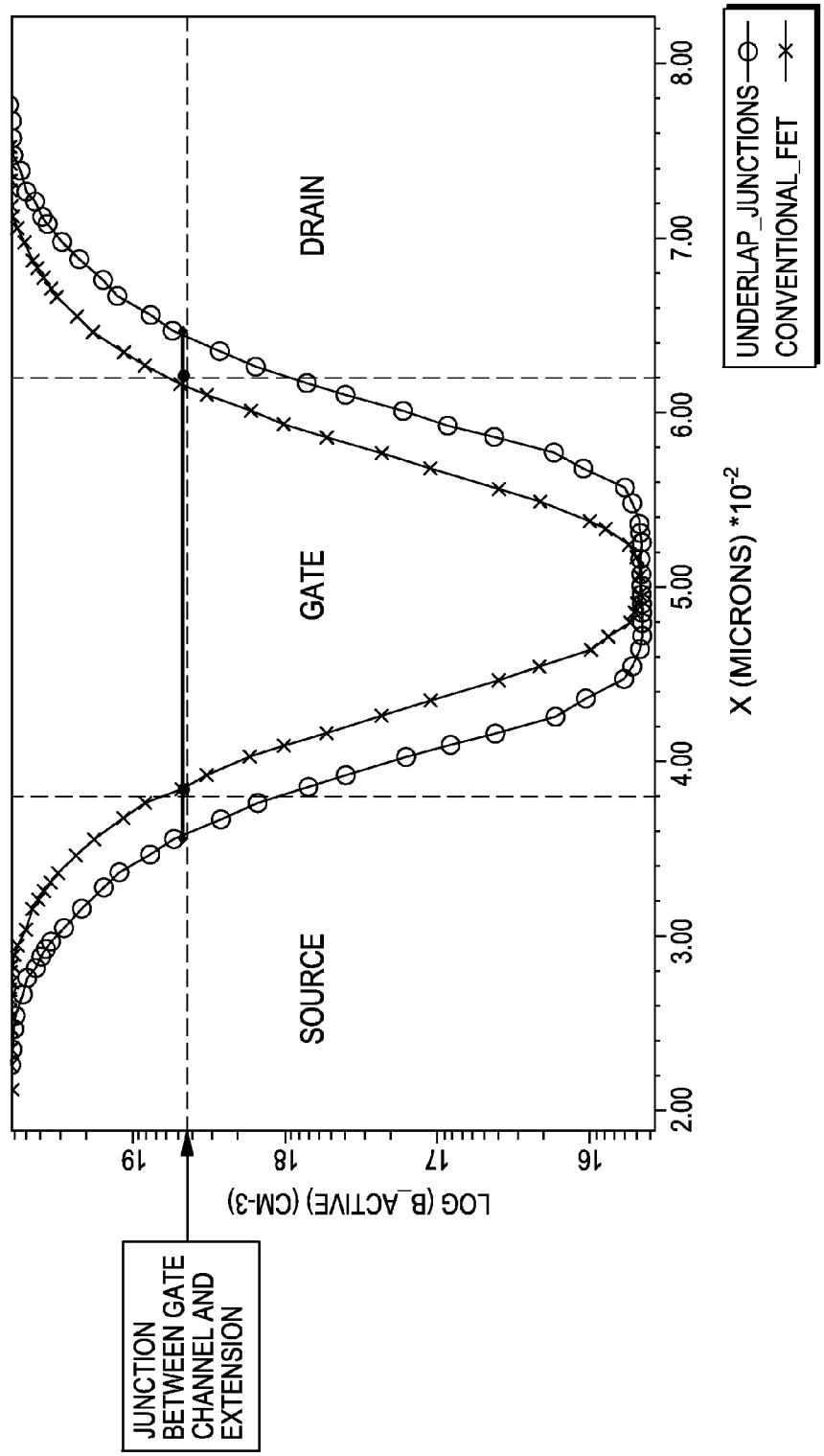
FIG. 4 is a graph of a profile through the center of the SOI layer comparing a profile for a conventional PFET device to a profile for a PFET with an underlapped junction.

FIG. 4 shows the 1D junction profile at the center of the SOI layer for two simulated devices. One device, corresponding to the first device in FIG. 5, is a conventional PFET and the second device, corresponding to the third device in FIG. 5, is a PFET with substrate bias and junction underlap. For a junction definition of 5e18 cm−3 (indicated by the box "JUNCTION BETWEEN GATE CHANNEL AND EXTENSION" in FIG. 4), the underlap design shows a gate region approximately 7 nanometers wider than the conventional design.

A two-dimensional process and device simulation of PFET devices with a gate-length of 25 nanometers, BOX thickness of 10 nanometers, and SOI thickness of 6 nanometers was carried out for: (a) a conventional PFET, (b) a PFET with substrate bias to affect the $V_T$, and (c) a PFET with the same substrate-bias as (b) plus junction underlap. FIG. 5 shows the device simulation results for these cases showing that the front-channel $V_T$ can be significantly reduced by applying negative substrate bias to PFET devices (comparing Rows 1 and 2). However, the $V_T$ reduction comes with a degradation of DIBL and sub-threshold slope (Columns 6 and 7). The degradation in short-channel effects can be entirely recovered by using an underlapped PFET junction design whereby the $V_T$ reduction is maintained while the DIBL and sub-threshold slope are restored to conventional junction design (Row 3).

That is, as demonstrated by FIGS. 4 and 5, the PFET device with negative substrate bias and underlapped junction (Row 3) has a lower $V_T$ than the conventional PFET device (Row 1) but without the degradation in DIBL and sub-threshold slope of the PFET device with negative substrate bias only (Row 2).

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A semiconductor structure comprising:
a semiconductor on insulator (SOI) substrate comprising:
a base semiconductor layer;
a buried oxide (BOX) layer in contact with the base semiconductor layer; and
an SOI layer in contact with the BOX layer;
a circuit formed with respect to the SOI layer, the circuit comprising:
an N type field effect transistor (NFET) having source and drain extensions in the SOI layer and an NFET gate;
a P type field effect transistor (PFET) having source and drain extensions in the SOI layer and a PFET gate;
a first well in the base semiconductor layer under the NFET; and
a second well in the base semiconductor layer under the PFET; and
the SOI substrate having a nonzero electrical bias;
wherein (i) the NFET source and drain extensions are overlapped with respect to the NFET gate and the PFET source and drain extensions are underlapped with respect to the PFET gate, or (ii) the NFET source and drain extensions are underlapped with respect to the NFET gate and the PFET source and drain extensions are overlapped with respect to the PFET; and
wherein for the NFET and PFET each having source and drain extensions and a gate channel underneath a gate, overlapped is defined as the source and drain extensions extending into the gate channel and underlapped is defined as the source and drain extensions spaced away from the gate channel.

2. The semiconductor structure of claim 1 wherein the NFET source and drain extensions are overlapped with respect to the NFET gate, the PFET source and drain extensions are underlapped with respect to the PFET gate and the SOI substrate has a negative SOI substrate bias.

3. The semiconductor structure of claim 2 wherein the NFET gate has a spacer directly contacting the NFET gate and the PFET gate has a spacer directly contacting the PFET gate such that the PFET gate spacer is thicker than the NFET gate spacer.

4. The semiconductor structure of claim 2 wherein the underlap is 2 to 6 nanometers.

5. The semiconductor structure of claim 1 wherein the PFET source and drain extensions are overlapped with respect to the PFET gate, the NFET source and drain extensions are underlapped with respect to the NFET gate and the SOI substrate has a positive SOI substrate bias.

6. The semiconductor structure of claim 5 wherein the NFET gate has a spacer directly contacting the NFET gate and the PFET gate has a spacer directly contacting the PFET gate such that the NFET gate spacer is thicker than the PFET gate spacer.

7. The semiconductor structure of claim 5 wherein the underlap is 3 to 8 nanometers.

8. The semiconductor structure of claim 1 wherein the SOI layer is an extremely thin SOI layer.

9. The semiconductor structure of claim 1 wherein the SOI layer is an extremely thin SOI layer having a thickness of 3 to 15 nanometers.

10. The semiconductor structure of claim 1 wherein the first well has a polarity opposite to a polarity of the second well.

11. A semiconductor structure comprising:
a semiconductor on insulator (SOI) substrate having a non-zero electrical bias being applied to the SOI substrate, the SOI substrate comprising:
a base semiconductor layer;
a buried oxide (BOX) layer in contact with the base semiconductor layer; and
an SOI layer in contact with the BOX layer; and
a circuit formed with respect to the SOI layer, the circuit comprising:
an N type field effect transistor (NFET) having source and drain extensions in the SOI layer and an NFET gate; and
a P type field effect transistor (PFET) having source and drain extensions in the SOI layer and a PFET gate;
wherein the NFET drain and source extensions are underlapped with respect to the NFET gate or the PFET drain and source extensions are underlapped with respect to the PFET gate; and
wherein for the NFET and PFET each having source and drain extensions and a gate channel underneath a gate, underlapped is defined as the source and drain extensions spaced away from the gate channel.

12. The semiconductor structure of claim 11, wherein the PFET source and drain extensions are underlapped with respect to the PFET gate and the SOI substrate has a negative SOI substrate bias.

13. The semiconductor structure of claim 12 wherein the NFET source and drain extensions are not underlapped or overlapped with respect to the NFET gate.

14. The semiconductor structure of claim 12 wherein the NFET source and drain extensions are overlapped with respect to the NFET gate.

15. The semiconductor structure of claim 12 wherein the NFET gate has a spacer and the PFET gate has a spacer such that the PFET gate spacer is thicker than the NFET gate spacer.

16. The semiconductor structure of claim 12 wherein the PFET source and drain extensions are underlapped in an amount of 2 to 6 nanometers with respect to an edge of the gate.

17. The semiconductor structure of claim 11 wherein the NFET source and drain extensions are underlapped with respect to the NFET gate and the SOI substrate has a positive SOI substrate bias.

18. The semiconductor structure of claim 17 wherein the PFET source and drain extensions are not underlapped or overlapped with respect to the PFET gate.

19. The semiconductor structure of claim 17 wherein the PFET source and drain extensions are overlapped with respect to the PFET gate.

20. The semiconductor structure of claim 17 wherein the NFET gate has a spacer directly contacting the NFET gate and the PFET gate has a spacer directly contacting the PFET gate such that the NFET gate spacer is thicker than the PFET gate spacer.

21. The semiconductor structure of claim 17 wherein the NFET extensions are underlapped in an amount of 3 to 8 nanometers with respect to an edge of the gate.

22. The semiconductor structure of claim 11 wherein the SOI layer is an extremely thin SOI layer having a thickness of 3 to 15 nanometers.

23. The semiconductor structure of claim 11 further comprising a first well in the base semiconductor layer under the NFET and a second well in the base semiconductor layer under the PFET wherein the first well has a polarity opposite to a polarity of the second well.

* * * * *